United States Patent [19]
Tam

[11] Patent Number: 5,604,162
[45] Date of Patent: Feb. 18, 1997

[54] PROCESS OF PREPARING TRITIATED POROUS SILICON

[75] Inventor: Shiu-Wing Tam, Downers Grove, Ill.

[73] Assignee: The University of Chicago, Chicago, Ill.

[21] Appl. No.: 671,325

[22] Filed: Jun. 27, 1996

Related U.S. Application Data

[62] Division of Ser. No. 517,001, Aug. 18, 1995.
[51] Int. Cl.$^6$ .................................................. H01L 21/302
[52] U.S. Cl. ........................... 437/225; 437/241; 437/929
[58] Field of Search .............................. 250/462.1, 483.1, 250/486.1, 493.1; 437/241, 929, 225

[56] References Cited

U.S. PATENT DOCUMENTS

| | | | |
|---|---|---|---|
| 5,122,305 | 6/1992 | Ashley | 252/646 |
| 5,137,659 | 8/1992 | Ashley | 252/646 |
| 5,272,355 | 12/1993 | Namavar et al. | 257/3 |
| 5,285,078 | 2/1994 | Mimura et al. | 257/3 |
| 5,301,204 | 4/1994 | Cho et al. | 372/69 |

*Primary Examiner*—R. Bruce Breneman
*Assistant Examiner*—Reneé Berry
*Attorney, Agent, or Firm*—Emrich & Dithmar

[57] ABSTRACT

A process of preparing tritiated porous silicon in which porous silicon is equilibrated with a gaseous vapor containing HT/T$_2$ gas in a diluent for a time sufficient for tritium in the gas phase to replace hydrogen present in the pore surfaces of the porous silicon.

4 Claims, 1 Drawing Sheet

PROCESS OF PREPARING TRITIATED POROUS SILICON

CONTRACTUAL ORIGIN OF THE INVENTION

The United States Government has rights in this invention pursuant to Contract No. W-31-109-ENG-38 between the U.S. Department of Energy and The University of Chicago representing Argonne National Laboratory.

This is a divisional of application Ser. No. 08/517,001, now allowed filed Aug. 18, 1995.

BACKGROUND OF THE INVENTION

Tritium is a beta emitter with a low energy emission spectrum. The maximum electron energy is 18.6 kev with a mean around 5.7 keV. Tritium has been employed in the past in gaseous form as the leading isotope for radioluminescent applications, such as emergency signs in aircraft and hospitals where maintenance-free/absolute reliability needs exist. These lighting devices operate by having tritium in gaseous form next to a phosphor material. The beta emission from the tritium causes optical excitation of the phosphor (such as zinc sulphide) which provides the light emission.

Limitations of these technologies include the fact that the only useful beta emitters are those that can be located near a phosphor. Most of the emitted electrons will fail to reach the luminescent materials, and without proper configuring, scale-up of the intensity/power level will be prohibitive. This is a direct result of the short emitted electron range in both gaseous and condensed phase media from a low energy beta emitter, such as a tritium. The range can vary from 6 mm in air to 6 microns in water to lengths that are substantially less than these distances in solid materials. But safety and environmental reasons dictate that only the lowest energy emitters (of which tritium is a prime candidate) be considered.

Another limitation is safety/environmentally related. Currently most utilization of tritium is in the gaseous form. In case of containment failure, the escape of tritiated gas into the environment is rapid and difficult to contain.

SUMMARY OF THE INVENTION

Therefore, an object of the present invention is to circumvent both limitations via the covalent bonding of tritium onto the interior surfaces of porous silicon. In effect the beta emitters are located at most a few angstroms from the luminescent center, namely the silicon species. Instead of a near-surface effect, the beta emitters have now become volumetric sources that are dispersed microscopically throughout the the entire porous silicon material. Practically all the beta emitters and all the silicon materials can interact with each other to the extent that the issue of the short range of the beta particles from tritium becomes irrelevant. Intensity/power level scale-up is now proportional to the volume of the device rather than to the area as in current technologies. The fact that the tritium is now encapsulated in a solid state environment with the tritium itself in condensed matter form (as interior surface chemisorbed species) renders its escape into the environment several orders of magnitude less likely than the gas-based configurations used in current technology. Thus, the present invention of a tritiated porous silicon (TPS) material provides an optical power source whose output will scale with the volume of the device, i.e., the best scaling possible, and in an embodiment where the tritium is much better contained.

In this context another object of the invention is to use TPS for a self-powered solid state light source with unique characteristics for lighting applications, such as TPS as a stand-alone optical/power source in silicon-based optoelectronic device technologies or in combination as photovoltaic devices.

The invention consists of certain novel features and a combination of parts hereinafter fully described, illustrated in the accompanying drawings, and particularly pointed out in the appended claims, it being understood that various changes in the details may be made without departing from the spirit, or sacrificing any of the advantages of the present invention.

BRIEF DESCRIPTION OF THE DRAWINGS

For the purpose of facilitating an understanding of the invention, there is illustrated in the accompanying drawings a preferred embodiment thereof, from an inspection of which, when considered in connection with the following description, the invention, its construction and operation, and many of its advantages should be readily understood and appreciated.

DESCRIPTION OF THE PREFERRED EMBODIMENT

Figure 1:
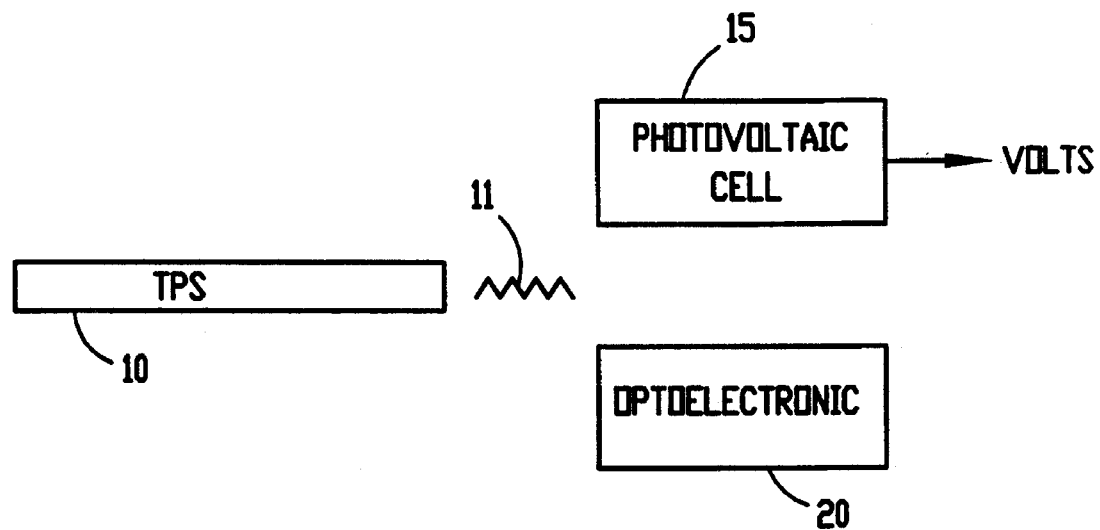
FIG. 1 is a schematic illustration of thin tritiated porous silicon material in combination with a photovoltaic device and an optoelectronic device.

Bulk silicon, because of its indirect band-gap, does not normally display optical excitation. However, a microporous form of crystalline silicon can be fabricate via electrodissolution of regular bulk silicon in HF solution as taught in U.S. Pat. Nos. 5,272,355; 5,301,204; and 5,285,078, the disclosures of which are herein incorporated by reference. Very high porosity (from about 50 to over about 90 percent by volume) can be generated. It was discovered recently that porous silicon (PS) is optically active. It exhibits photoluminescence as well as electroluminescence in the visible regime at room temperature. This discovery opens up the possibility of being able to utilize silicon, the most fundamental of electronic materials, in an optoelectronics context. In porous silicon the pore sizes are practically microscopic (as small as a few nm) preferably in the range of from about 1 to about 100 nanometers. The silicon crystallites that make up the walls of the pores are of similar microscopic dimension.

Despite extensive work devoted to the subject in recent times there des not yet exist a generally accepted understanding of the mechanism and the process of porous silicon formation. However, certain general features of the process are known. The infiltrating attachment on the silicon at the silicon-electrolyte interface results in very convoluted interconnected pore structures with pore tips as small as only a few nm across. This means that during the dissolution process the pore tips are in an active state, whereas the pore surfaces behind the pore tip regions remain passive. So the pore has continuous forward growth in the tip region while there is much slower "sideways" growth in the pore region behind the pore tips. This results in the formation of long but narrow pores characteristic of many types of porous silicon. The aspect ratio can be as much as 1 to 10 or even 1 to 100. There are at present a number of suggestions on the mechanism responsible for the conversion between active and passive states. They range from curvature-induced effects (due to the proximity to the pore tips) to quantum confinement (due to the small sizes of the crystallites making up the pore tips) to quantum confinement (due to the small sizes of the crystallites making up the pore walls) and to the presence of depletion layers frequently found near semiconductor/electrolyte interfaces.

Curvature-induced effects may arise from the fact that the pore surface in the region around the tip is necessarily nonplanar. In atomistic terms this necessitates a higher density of steps in the vicinity of that surface region. The increase in abundance of these surface line defects and their associated point defects such as kinks may in turn give rise to higher surface reactivity. However, these mechanism need not be mutually exclusive. They could be in effect concurrently, leading to the simultaneous evolution of more than one type of microstructural feature.

Nevertheless, independent of the physical origin of the optical properties of PS, it is known that hydrogenic species exist on the pore surfaces of this material. The present invention exploits this fact by depositing tritium species onto those same interior pore surfaces via the same electro-dissolution process that has been employed to synthesize porous silicon except for one key modification. The electrolyte is composed of a mixed hydrogen fluoride (HF)/tritiated fluoride (TF) solution. The relative HF/TF composition determines the relative amount of tritium that is deposited as surface chemical species (e.g., as Si—H—T or Si—O—H) onto the interior pore surfaces in the porous silicon network. That is the amount of tritium deposited depends on the ratio of HF to TF in the electrolyte solution. An alternative synthesis route of making tritiated porous silicon (TPS) is to equilibrate conventional PS with a vapor containing HT/T$_2$ gas in a diluent such as H$_e$ or H$_2$. This process depends on chemical vapor infiltration and exchange reaction between the tritium in the gas phase with the hydrogen present in the pore surfaces of PS. The amount of tritium deposited is controlled by the ratio of tritium present in the diluent gas. This is a vapor deposition method unlike that of the electrolytic route which depends on liquid phase processes. Both methods will deposit tritium onto the interior pore surfaces of the porous silicon resulting in a new material TPS. In this application the chemisorbed species is desired for thermal stability of the device with the tritiated porous silicon (TPS) acting as the luminescent material.

For the tritiated porous silicon samples, luminescence spectra is to be collected using a spectrophotometer. Whereas a deuterated silicon photoluminescence (PL) data is ascertained in tritiated silicon radioluminescence (RL) measurements are made. For both PL and RL the latter stages of the process are the same, namely electron-hole excitation and subsequent radiative recombination. This means that for the experimental results the major difference lies in the nature of the excitation source. In PL the excitation source is photons (i.e., light). In RL the corresponding source is electrons. However, the optical measurements are closely similar aside from the nature of the excitation source. It is important to note that even though in TPS one uses electrons as the excitation source the process has important differences with electroluminescence (EL). In EL the free charge carriers (such as electrons or holes) are injected into the materials and directed towards the region of luminescent centers under the action of an externally applied field. These energetic charge carriers dissipate their energy in the host material via mainly electron-hole pair excitations and photon generations. An example is the commonly available LED (light emitting diode) in which a p-n junction type device is utilized under a forward bias that provides the external field. When EL efficiency is low, the cause has often been attributed to the difficulty of injecting carriers into the system. This can arise for a wide variety of reasons, such as high contact resistance. In fact the best EL performance from conventional porous silicon at present has been obtained by using liquid electrolyte contact.

Wet contact is provided by immersing the PS layer in a liquid electrolyte which provides the medium for carrier injection. For p-type silicon substrate the carriers injected from the electrolyte would be the minority type (i.e., electrons). For technological applications there would be obvious difficulties in attempting to use PS-based devices that have to depend on liquid phase contacts. Realistic applications would require either solid state contact or some form of contactless designs, as has been suggested. The main idea behind TPS minimizes the difficulty of carrier injection due to two factors. Firstly, the electron emission source (namely the tritium) is dispersed microscopically throughout the host material. Secondly, the range of the electrons (of the order of a fraction of a micron) implies that the carrier injection would not be an issue.

Referring to FIG. 1, TPS 10 can act as a stand alone power source emitting light 11. Its function is similar to other advanced stand-alone energy generating/storage devices such as batteries. However, unlike advanced batteries, which involve power levels in the range of KW to MW (particularly for utilities and transportation applications), the operating range of TPS is expected to be mWs or less. It is suited for the low-level power requirement characteristic of highly integrated devices in optoelectronics and control technology. Strictly speaking, TPS is not an energy storage device like a battery. Once in place TPS would-generate light energy continuously. However, the very long time constant (11–12 years) allows TPS to operate as an energy generating source, while also effectively functioning like an energy storage device in the sense that power is available "on call" without the need for an external source of energy.

Another important application of this invention is to utilize TPS as a self-powered illumination source for low-level lighting applications where stand-alone and low or zero maintenance capabilities are of the highest priority.

Another important use of the invention involves the direct coupling of TPS to photovoltaic cells 15 to generate electricity. These uses illustrate the different ways that TPS can be utilized in energy technology applications. The photovoltaic application involves the direct conversion of luminescent energy to electrical power. The lighting technology uses TPS as the illumination source. The optoelectronic application utilizes the optical output 11 from TPS 10 as a power supply and also as an interconnect between different electronic components 20. The common denominators to all these options are the stand-alone capability, the compactness of an inorganic solid state source, and the practically uninterruptable nature of its operating characteristics. These factors make TPS well-suited for energy technology applications that involve remote site operation, industrial process monitoring and control in limited access environments, back-up retention of information/data, operation of energy devices (such as exit signs), and instrumentation panels in case of main power disruption. Further, TPS can be used as an on-board stand alone power supply for a silicon micromachine technology.

The fact that silicon has excellent electronic characteristics is well known. What is less appreciated is that it also-possesses exemplary thermomechanical properties. The excellent mechanical properties of silicon are why silicon-based micro-machine technology has developed rapidly in recent years. These machines such as illustrated in FIG. 1 as optoelectric devices 20 are Integrated devices called micro-electro-mechanical systems (MEMS). They may be composed of sensors, actuators, and/or electronic components all made out of silicon wafers using microfabrication techniques developed for the IC (integrated circuits) industry. Depending on their functions, these MEMS may range in size from a few microns to several hundred microns. Examples include micropumps, microvalves, and micro-acceleration sensors and related devices in a wide range of transportation, bio-medical, industrial process monitoring and control applications. The integration of TPS into many of these devices provides an on-board stand-alone micropower supply and also serves as the interconnect between the various electronic and sensor components. This combination can turn many current MEM's into self-powered smart (i.e. with problem-solving capability) micromachines.

It is known that the interior pore surface of porous silicon (PS) is extensively covered with hydride species. These include SiH, $SiH_2$ $SiH_3$. It has been suggested that the dihydride may be the dominant one with a coverage on the order of $2.3 \times 10^{14}$ $cm^{-2}$. Also, PS is a material that has a specific surface area as high as 900 $m^2$ $cm^{-3}$. One can estimate the typical tritium content in TPS as follows. Assuming that the TPS synthesis processes converts 10% of the surface $SiH_2$ into SiHT (chemisorbed) species, the concentration of SiHT (and hence of tritium) will be of the order of $2.1 \times 10^{20}$/c.c. This is equivalent to about 10 Ci $cm^{-3}$. For the present example a TPS film of area 1 $cm^2$ and 10 micron in thickness is considered. This film contains 10 mCi of tritium; however, TPS having radiation in the range of from about 10 mCI to 100 mCi is preferred. Conventional gas tube-type tritium-based lighting technology has a typical conversion capacity of around 0.4 ft.-L per Ci.

As stated, TPS should have significantly higher conversion capacity than in this example. This is due mainly to the much higher tritium concentration that can be achieved in TPS compared to the gas phase, as well as the total accessibility of the luminescent centers, to the emitted beta particles from the tritium. As a result, the conversion efficiency for TPS is estimated to be of the order of 34 ft.-L per Ci, substantially above that of the conventional technology. Thus, this thin film of TPS material (with a tritium content of about 10 mCi per c.c.) can generate initially 0.34 ft-L of light. For comparison an average TV monitor emits at a level of about 2 ft-L. For low light applications such as emergency signs and instrumentation panel lighting, the brightness requirement can be considerably below that of TV monitor conditions. Accordingly,. TPS is useful for stand-alone low level lighting applications either directly as a light source or as an optical power source for optoelectronic devices.

In traditional tritium lighting devices the tritium is in gaseous form contained in a gas tube whose surface is coated with phosphor-type materials. Due to the short mean free path of the emitted beta particles one cannot increase arbitrarily the output light intensity by increasing the tritium partial pressure and/or the diameter of the tube. This kind of approach is self-limiting by the self-absorption effect from the short mean free path. The typical tritium content utilized in gas-tube type of illumination devices is about half a curie, generating light at a level of around 0.2 ft.-L, which give a conversion efficiency of around 0.4 ft.-L. per Ci. Now the tritium concentration achievable in TPS can be easily an order of magnitude or more above that of the gas phase. Above it was indicated assuming a 10% coverage of the silicon-related sites during the formation of TPS would lead to a tritium, concentration of about 10 CI per cc. For comparison 0.5 atmosphere of tritium (which is the typical tritium content in conventional gas-tube devices) is equivalent to about 1.2 Ci per cc. This means that given the same volume of luminescent material for the tritium can act on, TPS would have a conversion efficiency of 0.4 times (10/1.18) ft.-L. per Ci. This arises from the higher tritium density in TPS, an expected result for a solid-state device.

However, this is only one advantage (but not the only one) of TPS. In a gas-tube type device only a thin layer of the luminescent material is accessible to the beta particles from the tritium. That layer has a thickness of the order of 1 micron or less, i.e., the range of the beta particles in the solid state. In TPS the tritium atoms are all dispersed microscopically through the volume of porous silicon. All of the luminescent material (i.e., the silicon) is accessible to some tritium. This leads to another increase of the TPS conversion efficiency by a factor on the order of the ratio of the thickness of the TPS film to the range of the beta particles. For a TPS film thickness of 10 microns, the enhanced conversion efficiency of TPS would be a value on the order of 34 ft.-L. per Ci. This is substantially above what can be achieved with conventional devices. The fundamental reason is that in TPS one manages to pack more tritium into a greater amount of accessible luminescent materials than is possible with conventional gas-tube type technologies.

In summary, the conversion efficiency of TPS has been approximately estimated with the following relations:

$E_{TPS} = E_{GAS} (N_{TPS}/N_{GAS}) d_{TPS}/1^{SOLID}$

Here $E_{GAS}$ is the conversion efficiency of gas-tube type tritium devices, $N_{TPS}$ is the tritium density in TPS, $N_{GAS}$ is the tritium density in the gas phase, $d_{TPS}$ is the thickness of the TPS film, $1_{SOLID}$ is the range of the beta particles in solid state materials.

It must be stressed that the above equation can only give an order of magnitude estimate. In particular, it was assumed that the internal quantum efficiencies of porous silicon and conventional phosphor-type luminescent materials are comparable. This need not be considered as overly optimistic since many results on conventional porous silicon have indicated a very high internal quantum efficiency. Nevertheless, a precise determination of the optical performance of TPS is not yet available.

Turning to the safety factors, tritium is a weakly emitting radionuclide for which the decay process is effected 100% through beta emission. To address the safety issues there are two important estimates to consider. One is the range of the beta particles in typical/window packaging materials that are likely candidates to be utilized to isolate the TPS from the external environment. The other issue is the dose on an individual due to failure of the window/packaging materials and the release of all the tritium into the air from the TPS-containing device.

The range of a beta particle in a solid material is inversely proportional to its density. For most solid materials simple estimates give ranges that are under 1 micron. This means that a few microns thick window/packaging barrier is more than sufficient to stop the beta particles. Note that this is in addition to the presence of the porous silicon (PS) whose very purpose and configuration have already been designed to absorb as much of the beta emission as possible.

The above considerations apply to normal operation. Considering a situation in which for whatever reason there is a complete breakage of the window/packaging material barrier and all the tritium embedded in the pore surfaces of the TPS material is instantaneously released into the air (a truly incredible event). The instantaneous total release of the tritium (using 10 mCi tritium content) is a worst case scenario. In reality the tritium atoms are bonded to the pore surfaces in the form of surface chemisorbed species such as hydrides (e.g., SiHT) or as hydroxide. The actual release mechanism is likely to be through a combination of the slower processes of thermal desorption and exchange. However, the instantaneous total release assumption in the following estimate is used to provide a conservative boundary. The form of the released tritium is assumed to be the oxide form which represents the worst biohazard case. The likely scenario for this to happen is total oxidation of the tritium content in the TPS (e.g., as in a fire).

Assume that the tritium (10 mCi in all) has been released into a room of volume V m$^3$ with no venting to the exterior. The maximum dosage on an individual is of the order 0.9 rem. This assumes that this person would stay in the unvented room for a certain minimum period after the release. For a room of size 20 m$^3$ with no ventilation, this minimum period amounts to about 16 hours. For reference the International Commission on Radiological Protection (ICRP) maximum permissible annual dosage is 5 rem. In fact, implementation of straightforward but effective safety procedures such as adequate ventilation and tritium detector/alarm systems would significantly further reduce the potential maximum dosage that can be delivered.

While there has been disclosed what is considered to be the preferred embodiment of the present invention, it is understood that various changes in the details may be made without departing from the spirit, or sacrificing any of the advantages of the present invention.

I claim:

1. A process of preparing tritiated porous silicon comprising equilibrating porous silicon with a vapor containing $HT/T_2$ gas in a diluent for a time sufficient for tritium in the gas phase to replace hydrogen present in the pore surfaces of the porous silicon.

2. The process of claim 1, wherein tritium is present in the porous silicon to provide radiation of not less than about 10 microcurries/cm$^3$.

3. The process of claim 1, wherein the diluent is $H_2$ or $H_e$.

4. The process of claim 1, wherein the amount of tritium deposited on the porous silicon is controlled by varying the Volume of $HT/T_2$ in the diluent.

* * * * *